United States Patent
Baeder

(10) Patent No.: US 12,294,417 B2
(45) Date of Patent: May 6, 2025

(54) MEASURING DEVICE AND A MEASUREMENT METHOD FOR DETERMINING A TOTAL RADIATED POWER

(71) Applicant: ROHDE & SCHWARZ GMBH & CO. KG, Munich (DE)

(72) Inventor: Uwe Baeder, Erding (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 138 days.

(21) Appl. No.: 17/778,307

(22) PCT Filed: Nov. 19, 2020

(86) PCT No.: PCT/EP2020/082744
§ 371 (c)(1),
(2) Date: May 19, 2022

(87) PCT Pub. No.: WO2021/099498
PCT Pub. Date: May 27, 2021

(65) Prior Publication Data
US 2022/0393775 A1    Dec. 8, 2022

(30) Foreign Application Priority Data
Nov. 20, 2019   (DE) .................... 10 2019 131 374.0

(51) Int. Cl.
*H04B 7/08*    (2006.01)
*G01R 29/10*   (2006.01)
*H04B 17/10*   (2015.01)

(52) U.S. Cl.
CPC ........... *H04B 17/102* (2015.01); *G01R 29/10* (2013.01); *H04B 7/086* (2013.01)

(58) Field of Classification Search
CPC .... H04W 24/08; H04W 24/00; H04B 17/102; H04B 7/084; G01R 29/10
See application file for complete search history.

(56) References Cited

U.S. PATENT DOCUMENTS

2015/0331022 A1    11/2015   Bai et al.
2019/0052376 A1*    2/2019   Chervyakov .......... H04B 17/29
(Continued)

FOREIGN PATENT DOCUMENTS

WO    2019/096802 A1    5/2019
WO    2021/099498 A1    5/2021

OTHER PUBLICATIONS

International Search Report and Written Opinion of the International Searching Authority for related International Application No. PCT/EP2020/082744, dated Feb. 18, 2021, 17 pages.
(Continued)

*Primary Examiner* — Sulaiman Nooristany
(74) *Attorney, Agent, or Firm* — DITTHAVONG, STEINER & MLOTKOWSKI

(57) ABSTRACT

A test system for determining a total radiated power of an antenna over the air comprises a measuring device and the base station. The measuring device is embodied to establish a communications connection to the base station to be tested over the air and to initiate and use over the air a function for fixing a present beam-lock function of the base station to be tested. The measuring device is further embodied to identify and measure a maximum effective isotropic radiated power, and to determine the total radiated power from previously known antenna characteristics and the measured maximum effective isotropic radiated power.

10 Claims, 3 Drawing Sheets

(56) References Cited

U.S. PATENT DOCUMENTS

2019/0173593 A1\* 6/2019 Chapman ............... H04B 17/12
2020/0280377 A1\* 9/2020 Haustein ............... H04B 17/104
2022/0190885 A1\* 6/2022 Nakayama ............... H04B 7/06

OTHER PUBLICATIONS

"5G; NR; User Equipment (UE) conformance specification; Radio transmission and reception; Part 2: Range 2 standalone (3GPP TS 38.521-2 version 15.2.0 Release 15)", ETSI TS 138 521-2, V15.2.0 (May 2019).
Friden et al., "Over-the-Air Testing for Total Radiated Power of Unwanted Emissions", 2018 IEEE, Sep. 3, 2018, 4 pages.
Sköld, "LS response on CEPT activities on measurement of 5G AAS in the field", 3GPP TSG WG4 Meeting #93, Nov. 22, 2019, 5 pages.

\* cited by examiner

MEASURING DEVICE AND A MEASUREMENT METHOD FOR DETERMINING A TOTAL RADIATED POWER

The present application is a U.S. national phase entry of PCT/EP2020/082744, filed on Nov. 19, 2020, which claims priority to German Patent Application No. 10 2019 131 374.0, filed on Nov. 20, 2019, which are incorporated herein by reference in their entirety.

The invention relates to a measurement system and a measurement method, with which a total radiated power (total radiated power) of an antenna of a base station can be determined over the air.

A determination of the total radiated power of an antenna of a base station has so far been almost impossible because it cannot be picked up via wired connections.

The invention is based on the object of creating a test system and a test method which allow a determination of the total radiated power of an antenna of a base station.

The object is achieved according to the invention for the device and method by the features of the independent claims. Advantageous further developments form the subject matter of the dependent claims relating back to these claims.

A test system according to the invention for determining a total radiated power of an antenna of a base station to be tested over the air comprises a measuring device and the base station to be tested. The measuring device is embodied in this context to establish a communications connection to the base station to be tested over the air and to initiate and use over the air (over the air) a function for fixing a present beam-lock function (beam-lock function) of the base station to be tested. The measuring device is further embodied to fix the present beam-lock function of the base station to be tested by means of the function for fixing the present beam-lock function of the base station to be tested and to measure a maximum effective isotropic radiated power (maximum effective isotropic radiated power). Optionally, it is embodied to identify the maximum effective isotropic radiated power before the measurement. Furthermore, the measuring device is embodied to determine the total radiated power of the antenna of the base station to be tested from previously known antenna characteristics of the antenna of the base station to be tested and the measured maximum effective isotropic radiated power. This ensures that an accurate determination of the total radiated power is possible.

By preference, the measuring device is embodied to simulate a mobile device. It is then unnecessary to intervene in the functioning of the base station.

By preference, the base station to be tested is an active antenna base station (active antenna system). In this case, functions of beam-forming (beam-forming) can be used to focus the main beam direction of the base station in the direction of the measuring device.

By preference, a measurement signal transmitted from the base station to be tested occupies only a proportion of a base-station signal in the time domain and/or in the frequency domain. A particularly efficient measurement can be achieved in this way.

By preference, the test system is embodied to prevent a communication of further mobile devices with the base station to be tested during the measurement of the maximum effective isotropic radiated power. A particularly interference-free measurement can be achieved in this way.

By preference in this context, a test command is protected and/or restricted. This ensures that the base station cannot be accidentally switched into a regular operating mode when in the test mode.

By preference, the base station to be tested is embodied to respond to the test command only after confirmation by a network operator. This ensures that a misuse of the test mode is not possible.

By preference, the base station to be tested is embodied to respond to the test command only within a predefined time window. This further improves security against an accidental test mode.

By preference, the test command is the function for fixing a present beam-lock function of the base station to be tested, and/or a command for the exclusion of further mobile devices from a communication with the base station.

In this manner, the base station is especially protected against misuse of these commands.

By preference, the base station to be tested is embodied to transmit with a maximum amplification during the measurement of the maximum effective isotropic radiated power. A particularly accurate measurement can be achieved in this way.

A test method according to the invention for determining a total radiated power of an antenna of a base station to be tested over the air, comprises the following steps:
- establishing of a communications connection between a measuring device and the base station to be tested over the air,
- initiation of a function for fixing a present beam-lock function of the base station to be tested over the air by the measuring device,
- fixing of the present beam-lock function of the base station to be tested by means of the function for fixing the present beam-lock function of the base station to be tested by the measuring device,
- measurement of a maximum effective isotropic radiated power by the measuring device, and
- determination of the total radiated power of the antenna of the base station to be tested from previously known antenna characteristics of the antenna of the base station to be tested and the measured maximum effective isotropic radiated power, by the measuring device.

This allows a determination of the total radiated power.

In the following, the invention is described by way of example based on the drawings which show an advantageous exemplary embodiment of the invention.

The drawings show:

Figure 1:
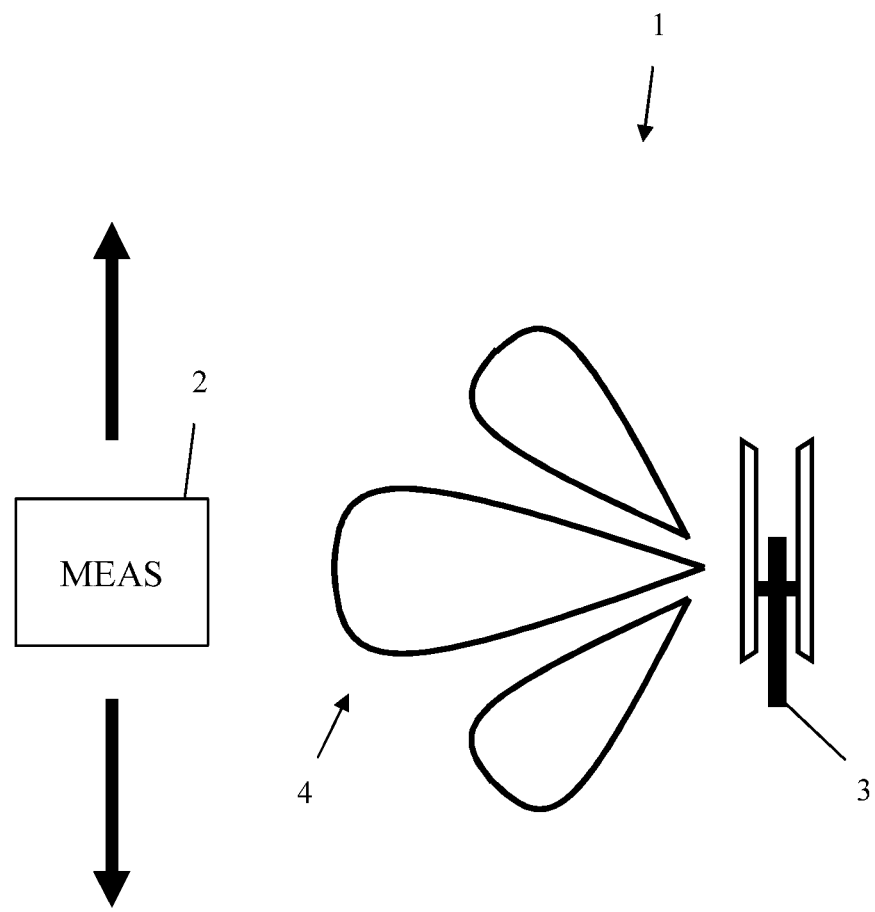
FIG. 1 shows a first exemplary embodiment of the test system according to the invention in an outline view.

Initially, the general construction and the general function of an exemplary embodiment of the test system according to the invention is presented and explained based on FIG. 1. Further details of the construction and function of a further exemplary embodiment of the test system according to the invention are described based on FIG. 2. Finally, the functioning of an exemplary embodiment of the test method according to the invention is described based on FIG. 3. The presentation and description of identical elements in similar drawings has, in some cases, not been repeated.

FIG. 1 shows a first exemplary embodiment of the test system 1 according to the invention. The test system 1 contains a measuring device 2 and a base station 3 to be tested. The object of the test system is to measure the transmissions 4 of the base station 3 by means of the measuring device 2.

The signals transmitted from the antenna of the base station 3 comprise a total radiated power (total radiated power). However, this cannot be measured in the field.

To determine the total transmitted power under real-world conditions, the maximum effective isotropic radiated power is measured according to the invention. For this purpose, a communications connection is initially set up between the measuring device 2 and the base station 3.

Optionally, the base station 3 is caused by the measuring device 2 to focus a main beam direction of the antenna of the base station 3 in the direction of the measuring device 2 by means of beam-forming.

Following this, in a non-optional step, a function for the fixing of a present beam-lock function of the base station 3 to be tested by the measuring device 2 is initiated over the air. By means of this function, the present beam-lock function is then fixed.

While the beam-lock function is fixed, a measurement of the maximum effective isotropic radiated power (maximum effective isotropic radiated power) takes place.

Based on a known antenna characteristic of the antenna of the base station 3 to be tested and of the measured maximum effective isotropic radiated power, the total radiated power of the antenna of the base station 3 to be tested can then be back calculated.

If the optional step of the focusing of the main beam direction in the direction of the measuring device 2 is not implemented, the calculation based on the measured effective isotropic beam power can also take place at another position of the antenna characteristic.

During the measurement and the communication, the measuring device 2 preferably simulates a mobile device. This allows a particularly realistic measurement, and, at the same time, interventions into the functioning of the base station 3 are not required.

To prevent conventional mobile devices from shifting the base station 3 used in the field into a corresponding test mode, the corresponding test commands are preferably protected and/or restricted. In particular, a confirmation of such a test mode by the network operator or an acknowledgement of such test commands can be used exclusively in predetermined time windows.

By preference, the base station 3 to be tested is an LTE base station and/or a 5G base station.

To achieve a particularly accurate measurement, the base station 3 to be tested can additionally be caused by the measuring device 2 not to implement any communication with other mobile devices during the measurement. Such a test command can also be protected or restricted by the base station 3 to prevent misuse.

To further increase the accuracy of the measurement, the base station should if possible be embodied to transmit with maximum transmission power or respectively maximum amplification during the measurement.

The base station is preferably an active antenna base station (active antenna system base station).

To achieve an efficient measurement, the base station 3 can generate the measurement signal to be measured by the measuring device 2 in such a manner that this does not exploit the entire spectrum available to the base station 3 and/or the entire time within a slot. This allows a particularly rapid measurement.

An additional function of the test system according to the invention is, optionally, the mobility of measuring device 2.

That is, the measuring device 2 is a mobile measuring device. It can be moved past the base station 3. According to the invention, several measurements at different sites around the base station 3 can preferably be implemented. The previously described steps can then be repeated at each of these sites. Accordingly, the function of beam-forming (beam-forming) can especially be tested alongside the total radiated power. Furthermore, an increase in the accuracy of the measurement of the total radiated power can be achieved with the use of several measurements.

Figure 2:
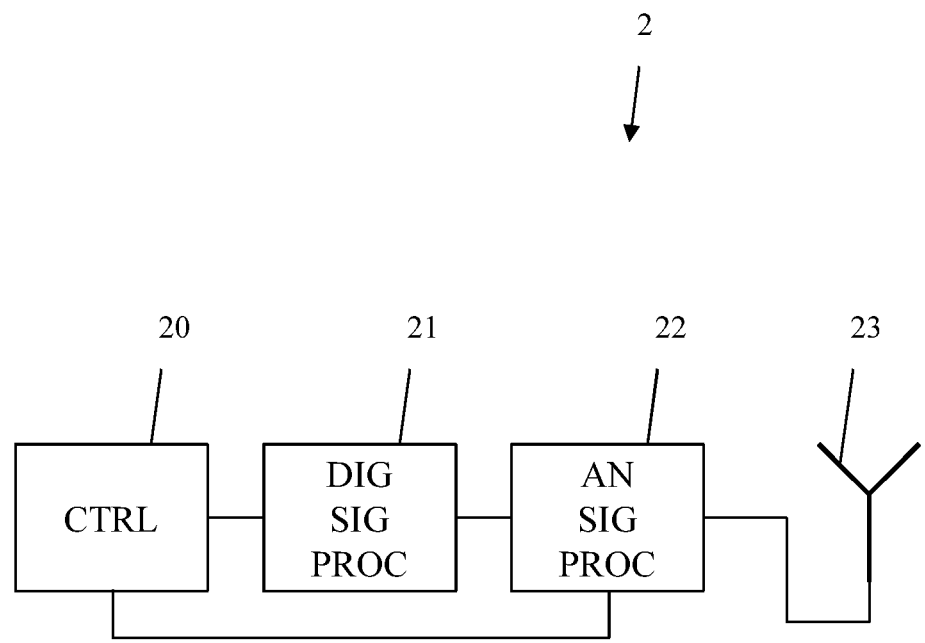
FIG. 2 shows a second exemplary embodiment of the test system according to the invention in a detail view.

FIG. 2 shows a detailed view of a measuring device 2 of a further exemplary embodiment of the present invention. The measuring device 2 contains a control unit 20 connected to a digital signal processing unit 21, which is in turn connected to an analogue signal processing unit 22. The latter is connected to an antenna 23.

In this context, the control unit 20 controls the digital signal processing unit 21 and the analogue signal processing unit 22.

To transmit a signal to the base station 3 to be tested, the control unit 20 generates a digital representation of the signal and communicates the former to the digital signal processing unit 21. From this, the digital signal processing unit 21 generates a digital transmission signal, which it communicates to the analogue signal processing unit 22. The latter generates from this an analogue high-frequency transmitted signal, which is transmitted via the antenna 23.

To receive a measurement signal from the base station 3 to be tested, the former is picked up by the antenna 23 and communicated to the analogue signal processing unit 22. The latter generates from this a digital received signal and communicates this to the digital signal processing unit 21. The digital signal processing unit 21 determines from the digital received signal the maximum effective isotropic radiated power and communicates this to the control unit 20, which determines from it the total radiated power. For this purpose, it additionally utilises the previously known antenna characteristic of the antenna of the base station 3 to be tested.

Figure 3:
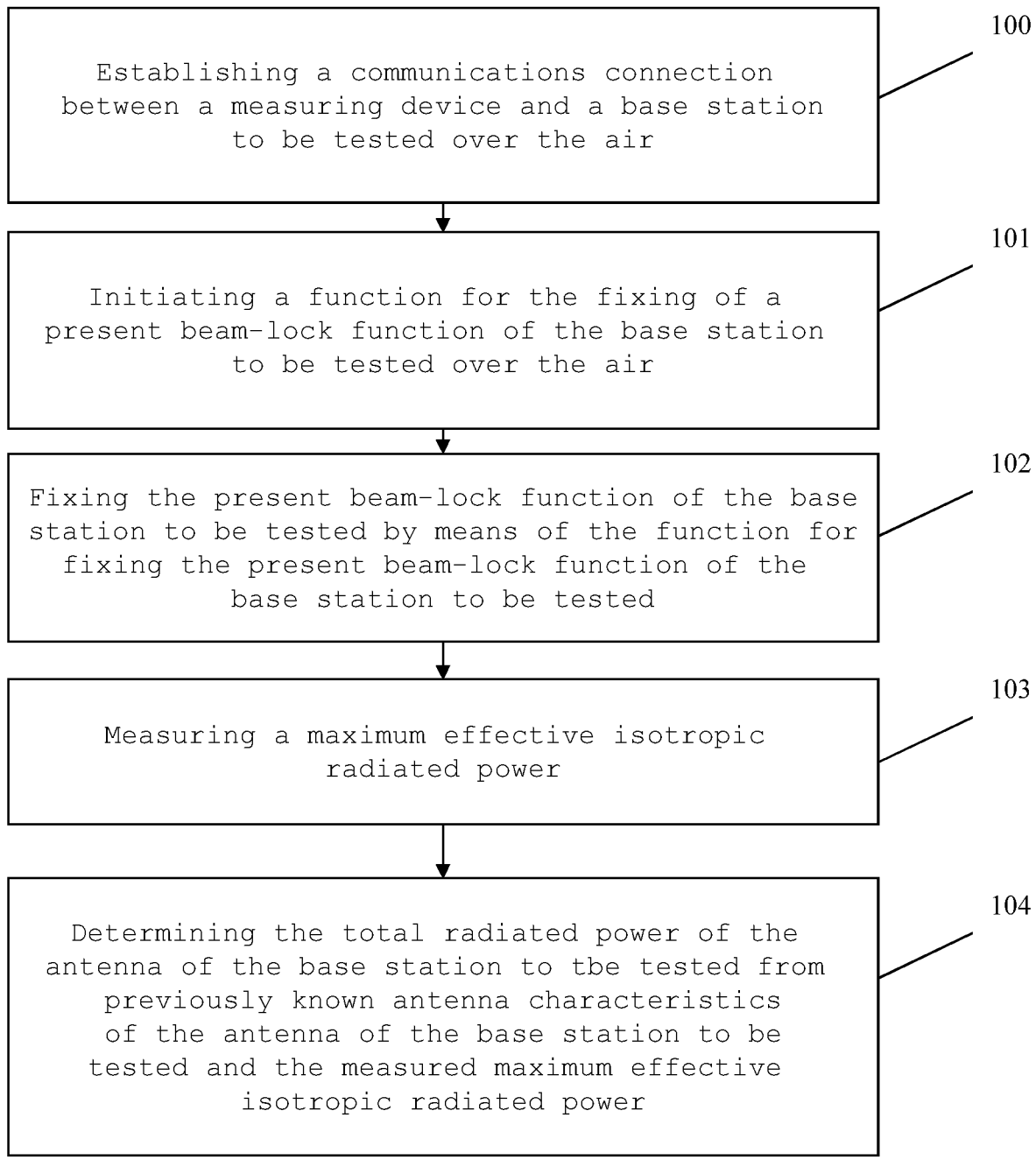
FIG. 3 shows an exemplary embodiment of the test method according to the invention in a flowchart.

FIG. 3 shows an exemplary embodiment of the measurement method according to the invention in a flow diagram.

In a first step 100, a communications connection between a measuring device and a base station to be tested is set up over the air.

In a second step 101, a function for the fixing of a present beam-lock-function (beam-lock-function) is initiated over the air.

In third step 102, the present beam-lock function (beam-lock-function) of the base station to be tested is fixed by means of the function for fixing the present beam-lock function of the base station to be tested.

In a fourth step, 103, a maximum effective isotropic radiated power is measured.

In a fifth step 104, the total radiated power of the antenna of the base station to be tested is determined from a previously known antenna characteristic of the antenna of the base station to be tested and the measured maximum effective isotropic radiated power.

The present invention is not restricted to the illustrated exemplary embodiments and especially not to the illustrated communications standards. The present invention can be used with numerous different communications standards. Other forming factors of the devices used can also be used. All of the features described above, or the features shown in the Figs. can be advantageously combined with one another as required within the framework of the invention.

The invention claimed is:

1. A test system for determining over the air a total radiated power of an antenna of a base station to be tested, comprising:
   a measuring device,
   the base station to be tested,
   wherein the measuring device is embodied to establish
      a communications connection to the base station to be tested over the air,
      to initiate a function for fixing a present beam-lock function of the base station to be tested over the air,
      by means of the function for fixing the present beam-lock function of the base station to be tested, to fix the beam-lock function of the base station to be tested,
      to measure a maximum effective isotropic radiated power, and
      to determine the total radiated power of the antenna of the base station to be tested from previously known antenna characteristics of the antenna of the base station to be tested and the measured maximum effective isotropic radiated power,
   wherein the test system is embodied to prevent a communication of further mobile devices with the base station to be tested during the measurement of the maximum effective isotropic radiated power.

2. The test system of claim 1,
   wherein the measuring device is embodied to simulate a mobile device.

3. The test system of claim 1,
   wherein the base station to be tested is an active antenna base station.

4. The test system of claim 1,
   wherein a measurement signal transmitted from the base station to be tested occupies only a proportion of a base-station signal in the time domain and/or in the frequency domain.

5. The test system of claim 1,
   wherein a test command is protected and/or restricted.

6. The test system of claim 5,
   wherein the base station to be tested is embodied to respond to the test command only after confirmation by a network operator.

7. The test system of claim 5,
   wherein the base station to be tested is embodied to respond to the test command only within a predefined time window.

8. The test system of claim 5,
   wherein the test command is the function for fixing a present beam-lock function of the base station to be tested, and/or a command for the exclusion of further mobile devices from a communication with the base station.

9. The test system of claim 1,
   wherein the base station to be tested is embodied to transmit with a maximum amplification during the measurement of the maximum effective isotropic radiated power.

10. A test method for determining over the air a total radiated power of an antenna of a base station to be tested, with the following steps:
    establishing a communications connection between a measuring device and the base station to be tested over the air,
    initiation of a function for fixing a present beam-lock function of the base station to be tested over the air by the measuring device,
    fixing of the present beam-lock function of the base station to be tested, by means of the function for fixing the present beam-lock function of the base station to be tested by the measuring device,
    measurement of a maximum effective isotropic radiated power by the measuring device,
    determination of the total radiated power of the antenna of the base station to be tested from previously known antenna characteristics of the antenna of the base station to be tested and the measured maximum effective isotropic radiated power, by the measuring device, and
    preventing a communication of further mobile devices with the base station to be tested during the measurement of the maximum effective isotropic radiated power.

* * * * *